United States Patent
Wade et al.

(10) Patent No.: US 9,362,729 B2
(45) Date of Patent: Jun. 7, 2016

(54) WEATHERPROOF OUTDOOR ELECTRICAL BOX

(71) Applicant: Ply Gem Industries, Inc., Cary, NC (US)

(72) Inventors: John M. Wade, Pleasant Hills, MO (US); Brent A. Dilonardo, Liberty, MO (US)

(73) Assignee: PLY GEM INDUSTRIES, INC., Cary, NC (US)

( * ) Notice: Subject to any disclaimer, the term of this patent is extended or adjusted under 35 U.S.C. 154(b) by 0 days.

(21) Appl. No.: 14/743,524

(22) Filed: Jun. 18, 2015

(65) Prior Publication Data

US 2015/0372467 A1 Dec. 24, 2015

Related U.S. Application Data

(60) Provisional application No. 62/013,633, filed on Jun. 18, 2014.

(51) Int. Cl.
*H02G 3/08* (2006.01)
*H02G 3/10* (2006.01)
*H02G 3/38* (2006.01)

(52) U.S. Cl.
CPC ................ *H02G 3/10* (2013.01); *H02G 3/085* (2013.01); *H02G 3/088* (2013.01); *H02G 3/385* (2013.01)

(58) Field of Classification Search
CPC ......... H02G 3/08; H02G 3/081; H02G 3/088; H02G 3/10; H02G 3/12; H02G 3/121; H02G 3/123; H02G 3/16; H02G 3/085; H02G 3/385; H05K 5/00; H05K 5/02; H01R 13/46; H01R 13/50; H01R 13/506; H01R 13/52; H01R 13/533; E04F 19/08

USPC ............. 174/50, 53, 57, 58, 480, 481; 220/3.2–3.9, 4.02; 248/906; 439/535

See application file for complete search history.

(56) References Cited

U.S. PATENT DOCUMENTS

| | | | | |
|---|---|---|---|---|
| 3,620,404 A | * | 11/1971 | Grasso | E04F 19/08 174/57 |
| 5,223,673 A | * | 6/1993 | Mason | H02G 3/16 174/57 |
| 6,956,171 B1 | | 10/2005 | Gretz | |
| 6,965,078 B1 | | 11/2005 | Gretz | |
| 7,005,578 B2 | | 2/2006 | Gretz | |
| 7,087,837 B1 | * | 8/2006 | Gretz | H02G 3/121 174/57 |
| 7,115,820 B1 | | 10/2006 | Gretz | |
| 7,151,219 B1 | | 12/2006 | Gretz | |
| 7,378,591 B2 | | 5/2008 | Dihn | |
| 7,381,890 B1 | | 6/2008 | Kinnard et al. | |
| 7,388,162 B1 | * | 6/2008 | Gretz | H02G 3/121 174/480 |
| 7,435,900 B1 | | 10/2008 | Gretz | |
| 7,518,061 B1 | | 4/2009 | Gretz | |
| 7,619,162 B2 | * | 11/2009 | Dinh | H02G 3/12 174/50 |
| 7,645,937 B2 | * | 1/2010 | Bhosale | H02G 3/123 174/57 |
| 7,674,974 B1 | * | 3/2010 | Shotey | H02G 3/088 174/57 |

* cited by examiner

*Primary Examiner* — Angel R Estrada
(74) *Attorney, Agent, or Firm* — Lathrop & Gage LLP

(57) ABSTRACT

The present invention is directed to a weatherproof electrical box for protecting an electrical connection from the elements. The electrical box includes a housing comprising four side walls and a base forming an interior space, a pivotal cover that latches onto the housing, a circumferential flange extending outwardly from the upper end of the housing, and an outer flange. The outer flange can be releasably attached to corrugations on the housing.

21 Claims, 4 Drawing Sheets

WEATHERPROOF OUTDOOR ELECTRICAL BOX

CROSS-REFERENCE TO RELATED APPLICATIONS

This application claims the benefit of priority of U.S. Provisional Application No. 62/013,633, filed Jun. 18, 2014.

TECHNICAL FIELD

This disclosure relates generally to electrical boxes. More specifically, this disclosure concerns outdoor weatherproof electrical boxes.

BACKGROUND

Electrical boxes conceal and house electrical connections, which deter tampering and increase the safety of using electrical connections. Electrical boxes are typically mounted vertically prior to the completion of construction to be used in connection with electrical and telecommunication connections.

For outdoor electrical connections, the electrical box housing said connections must be weatherproof and water resistant in order to protect the electrical outlet from environmental conditions such as rain and snow. A cover may be provided for outdoor electrical outlet boxes to protect the outlet housed in the electrical box from environmental conditions. However, the cover must be removed when the outlet is in use, i.e. when something is plugged in to the electrical outlet. This provides a route for moisture to seep into the outlet.

Additionally, electrical boxes are typically mounted flat against a surface. A flange may be used to provide support and a tighter connection between the electrical box and the surface, but having the electrical box very close to the wall may allow moisture to enter the electrical box, for example, when rainwater flows down the surface.

SUMMARY

The objective of this disclosed technology is to provide an outdoor weather resistant electrical box. The electrical connection is protected from environmental elements, including moisture. The electrical box has a housing and an outer flange, which are attached to one another for waterproofing purposes. The housing contains corrugations on the exterior which reciprocates with an inwardly extending locking component of the outer flange.

A cover plate encloses the housing and provides a barrier to keep environmental elements from entering the electrical box. The pivotal cover plate contains at least one cut out so that the cover plate may still be engaged when the electrical connection is in use. An electrical cord may pass through the cut out, and the electrical box remains enclosed and therefore resistant to environmental elements. When the electrical connection is not in use, a removable plug may be used to seal the cut out and protect the electrical connection.

In one embodiment, one electrical cord is plugged into the electrical connection, and the cover plate contains two cut outs. The electrical cord passes through the first cut out, and a plug is used to seal the second cut out, thereby protecting the interior of the electrical box from environmental exposure.

BRIEF DESCRIPTION OF THE DRAWINGS

The detailed description particularly refers to the accompanying figures in which.

DETAILED DESCRIPTION

The disclosed technology is directed to an electrical box for recessing an electrical device within a wall. A flange is "snapped-in" to the housing of the electrical box, and a receptacle plate is attached in the interior of the housing. The electrical box is resistant to the environmental elements such as rain and moisture by using two flanges and a cover plate. The electrical box further insulates the electrical connection by using plugs and cut outs in connection with the cover plate so the cover plate may be engaged while the electrical box is in use. The cut outs also facilitate the passage of an electrical cord.

Figure 1:
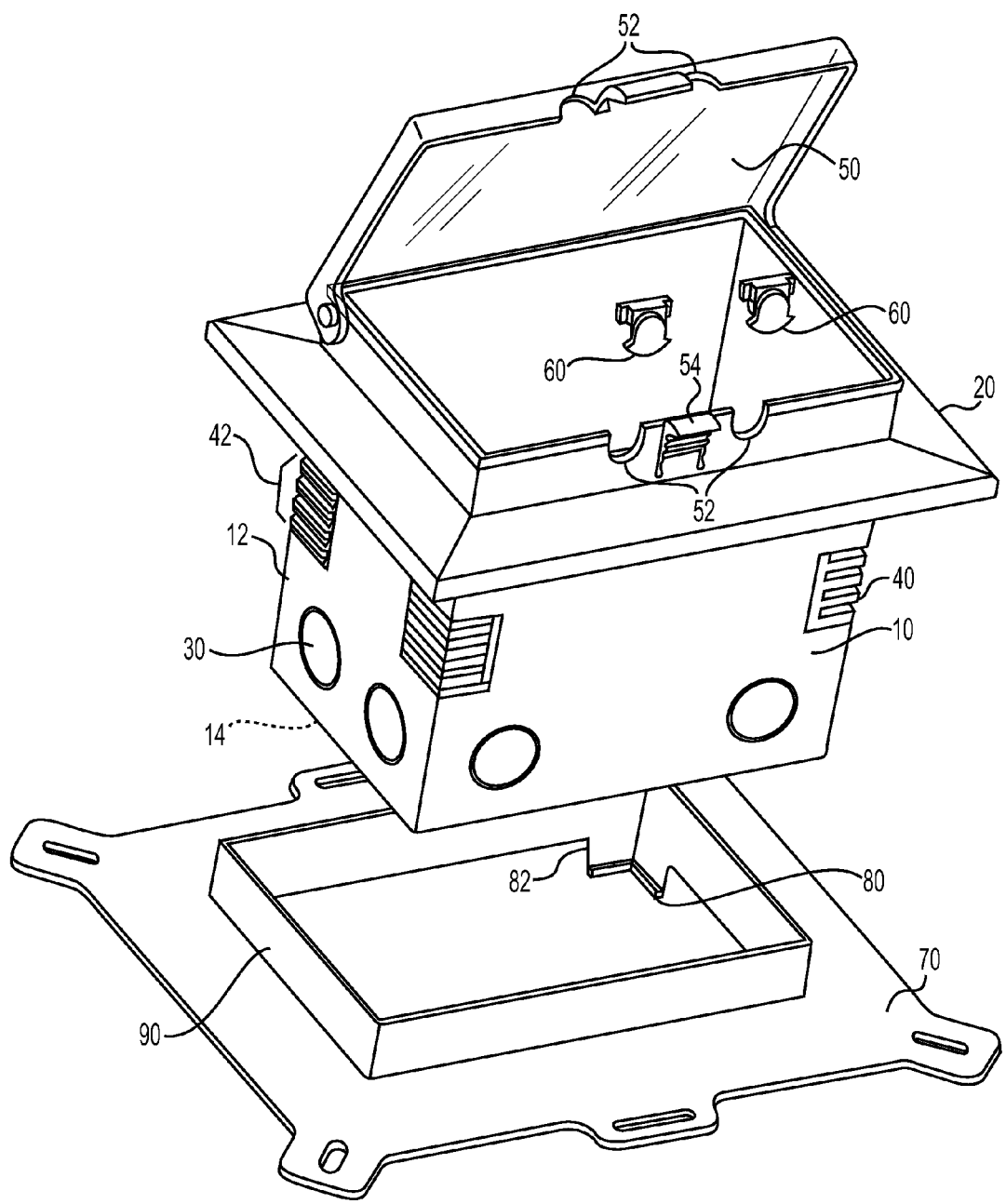
FIG. 1 is a perspective view of the electrical box with the lid open, before it has been fitted into the flange.

As shown in FIG. 1, the electrical box housing 10 has four side walls 12 and a base 14. A circumferential flange 20 is attached to the upper edge of the housing 10, and extends outwardly from the housing walls 12. The housing 10 also contains at least one knockout 30 disposed on at least one of the four walls 12, or on the base 14. In one embodiment, there are two knockouts 30 on each of the four walls 12, and at least two knockouts 30 on the base 14 of the housing 10.

The knockouts 30 facilitate the entry of wire, cable, pipe, or other device into the housing 10 of the electrical box. The knockouts are typically circular, but can be any variety of shapes, including but not limited to triangles, hexagons, squares, or other geometric shapes.

In one embodiment, the circumferential flange 20 extends from the housing outwardly and perpendicular to the housing 10. In another embodiment, the circumferential flange 20 extends from the housing 10 outwardly and downwardly. This trapezoidal shape helps to further weatherproof the electrical box by diverting elements such as water away from the housing. In addition to the circumferential flange 20, the electrical box also has an outer flange 70 which can be removably attached to the electrical box and provides a second barrier between the elements and the interior of the housing 10. In one embodiment, the outer flange 70 extends outwardly and perpendicular to the housing 10. In another embodiment, the outer flange extends outwardly and downwardly. The outer flange abuts the surface in which the electrical box is recessed in order to provide increased stability and a tighter connection between the surface and the electrical box.

The housing 10 contains at least one corrugation 40 on the exterior of the housing 10 where each side wall 12 meets to form a corner, which serves as a locking component with the outer flange 70. From the base 14, the corrugations 40 are above the knockouts 30 and nearer to the circumferential flange 20. The corrugations 40 form a corrugated section 42, which preferably spans between 0.5-1.5 inches.

When multiple corrugations 40 form the corrugated section 42, the outer flange 70 can be adjusted along the corrugations to increase or decrease the distance between the circumferential flange 20 and the outer flange 70. Multiple corrugations 40 allow for the outer flange 70 to be adjusted to abut the surface or wall in which the electrical box is recessed.

A pivotal cover plate 50 is attached to the electrical box above the circumferential flange 20. The cover plate 50 keeps out moisture and helps weatherproof the electrical connection housed in the electrical box. The cover plate 50 has at least one cut out 52 which allows an electrical cord to pass through while the cover plate 50 is closed. This prevents the intrusion of moisture. The cut outs 52 can be round and would allow an electrical cord to pass through the cut out 52. The cover plate 50 latches to the electrical box at the lid latch 54.

The cut outs 52 are configured to receive a removable plug 60 to seal the cover plate 50 when the electrical cord is not in position in order to protect the electrical connection from exposure to environmental factors. The plug 60 is easily removed when the electrical connection is in use and an electrical cord requires use of the cut out 52. The plug 60 can be circular. In one embodiment the plug 60 fits into the cut out 52 and extends radially downward over part of the upper edge of the housing 10 above the circumferential flange 20 to further seal and weatherproof the electrical connection inside the housing 10 of the electrical box.

In one embodiment, the cover plate 50 has two cut outs 52 which align with cut outs 52 in the upper end of the housing 10 to form an opening between the exterior and interior of the housing 10. When there is one electrical cord plugged in to the electrical connection, one cut out 52 facilitates the passage of the electrical cord, and the other cut out 52 has a plug 60 placed in the cut out 52 to seal the interior of the housing 10 from environmental elements.

The housing 10 of the electrical box interlocks with an outer flange 70 through the corrugations 40 on the exterior of the housing 10. The outer flange has at least one lower vertical extension 82 descending from at least one corner of the outer flange 70. The lower vertical extension terminates in at least one inwardly extending protrusion locking engagement 80 to interlock with the corrugations 40 on the exterior of the housing 10. The locking engagement 80 interlocks with the corrugations 40 as a "snap-in" mechanism; the housing 10 is "snapped-in" to the outer flange 70.

The outer flange 70 has a vertical extension 90 which extends from the inner circumference of the flange 70. The vertical extension 90 is preferably between 0.25-0.75 inches in height. The vertical extension 90 further insulates and weather proofs the electrical box, and protects the electrical connection from environmental factors.

Figure 2:
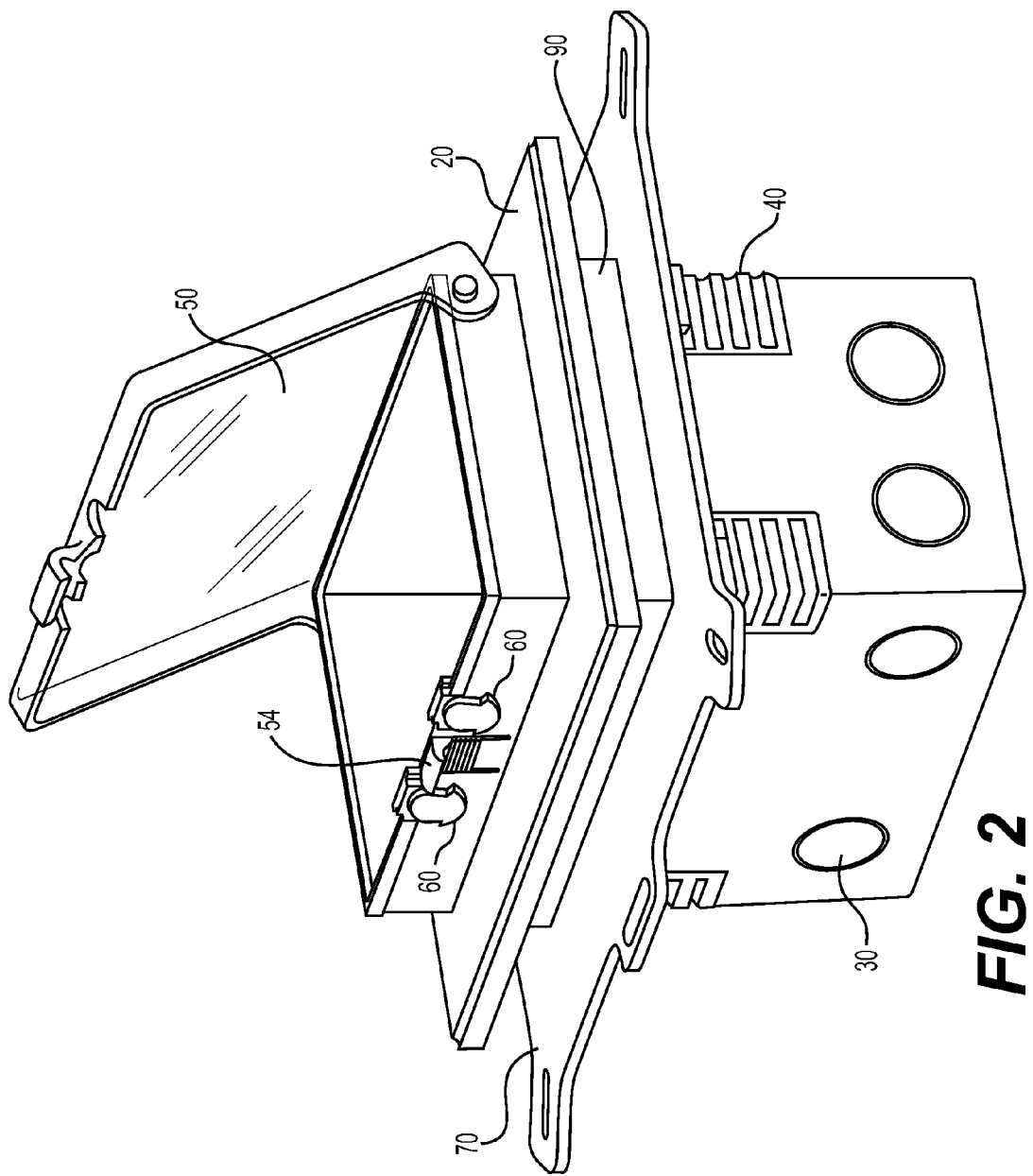
FIG. 2 is a side view of the electrical box with the lid open after it has been fitted into the flange.

FIG. 2 shows the assembled housing 10 and flange 70. In one embodiment, the vertical extension 90 is 0.5 inches. The plugs 60 are placed in the cut outs 52 when the electrical connection is not in use and an electrical cord is not plugged in.

Figure 3:
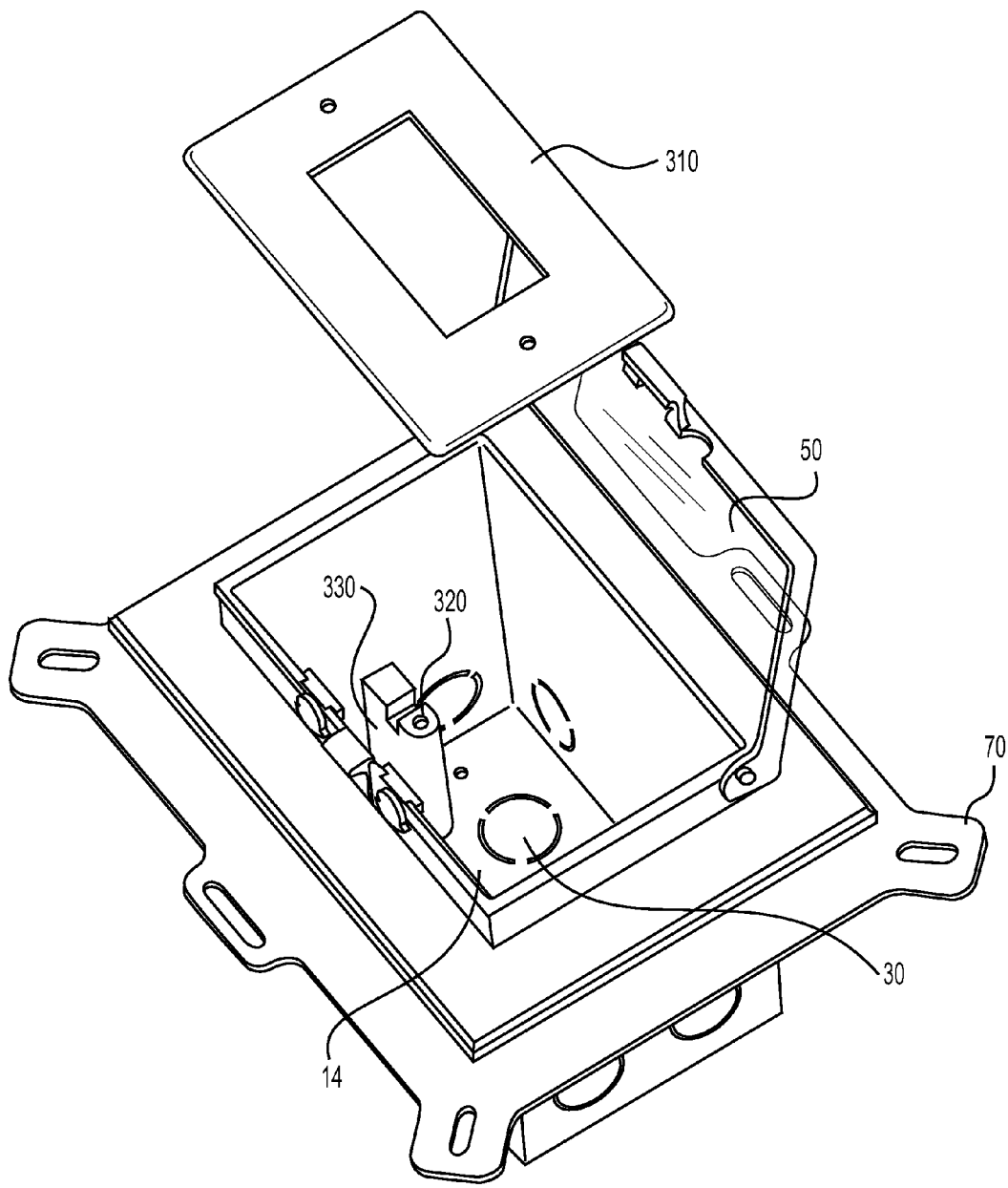
FIG. 3 is an angled view of the electrical box and the receptacle plate before the receptacle plate has been attached to the electrical box.

As shown in FIG. 3, a receptacle plate 310 fits in the interior of the housing 10. The receptacle plate 310 is typically attached with screw, nail, or other appropriate fastening component to the interior of the housing 10 through holes 320 located in the protrusions 330. A ground fault circuit receptacle is first attached using holes 320 located in the protrusions 330, and then the receptacle plate 310 is attached over the ground fault circuit receptacle.

Figure 4:
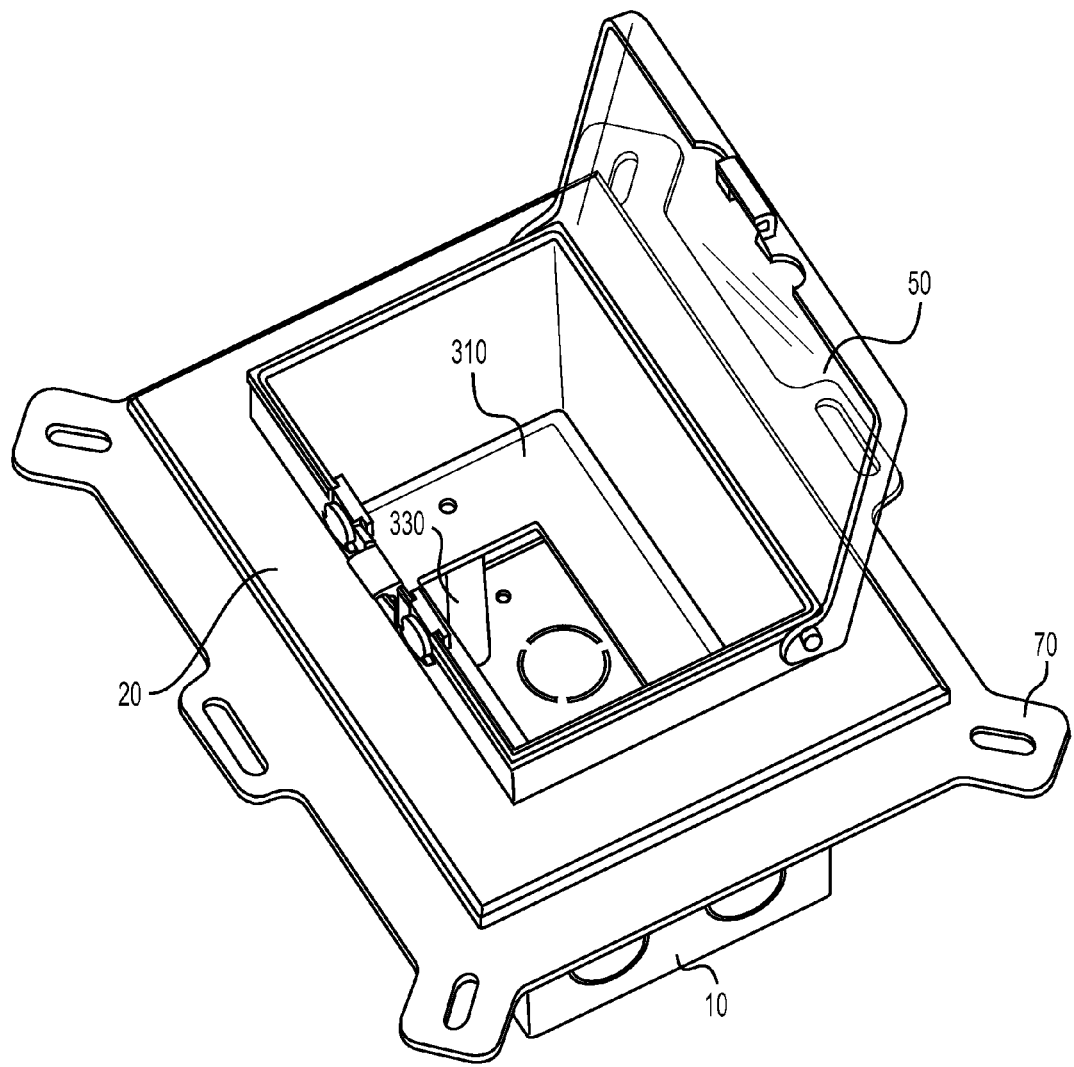
FIG. 4 is an angled view of the assembled electrical box, flange, and receptacle plate.

As shown in FIG. 4, the housing 10, flange 70, and receptacle plate 310 are assembled. The flange 70 is "snapped-in" to the housing 10 by interlocking the locking component 80 of the flange 70 with the corrugations 40 of the housing 10. The receptacle plate 310 is attached at the protrusions 330 through the holes 320 by passing a fastening component through the receptacle plate 310.

In one embodiment the receptacle plate 310 contains at least one aperture for allowing an electrical plug to attach to the outlet.

Figures and additional description that further disclose embodiments of the inventive system are enclosed. Many different arrangements of the various components depicted, as well as components not shown, are possible without departing from the spirit and scope of the present invention. Embodiments of the present invention are described herein with the intent to be illustrative rather than restrictive. Alternative embodiments will become apparent to those skilled in the art that do not depart from its scope. A skilled artisan may develop alternative means of implementing the disclosed improvements without departing from the scope of the present invention. Further, it will be understood that certain features and subcombinations are of utility and may be employed without reference to other features and subcombinations and are contemplated within the scope of the invention. The description should not be restricted to the specific described embodiments.

It is claimed:

1. An electrical box for recessing an electrical device within a wall comprising:

a housing including four side walls forming an interior space, each side wall including an upper edge and a circumferential flange extending outwardly from each housing wall, the interior space including recessed pegs for securing an electrical receptacle in position, the housing further including a pivotal cover plate for protecting the electrical receptacle from exposure to the environment, and cutouts disposed within the upper edge of at least one of the side walls to facilitate the passage of an electrical extension cord, the cutouts configured to receive removable plugs to prevent intrusion of moisture when the extension cord is not in position; and an outer flange for engagement with the housing separated from the circumferential flange and extending outward transversely from the side walls of the housing, the outer flange including at least one inwardly extending protrusion for use as a locking engagement with at least one corrugation disposed within an exterior of the side walls of the housing.

2. The electrical box of claim 1, wherein the circumferential flange extends outwardly and downwardly.

3. The electrical box of claim 1, wherein the outer flange extends outwardly and downwardly.

4. The electrical box of claim 1, further comprising multiple corrugations at a corner of the exterior of the sidewalls of the housing.

5. The electrical box of claim 1, wherein the pivotal cover, housing, and plugs form a waterproof barrier to protect the interior electrical connection.

6. The electrical box of claim 1, further comprising at least one knockout disposed on one of the four side walls or on a base of the electrical box.

7. The electrical box of claim 6, wherein there is at least one knockout on each of the side walls and on the base of the electrical box.

8. The electrical box of claim 1, wherein a stabilizing flange extends transversely from the outer flange and extending upwardly from an inner perimeter of the outer flange.

9. The electrical box of claim 1, wherein the outer flange includes four inwardly extending protrusions for locking engagements with four corrugations within the side walls of the housing.

10. The electrical box of claim 1, further comprising a receptacle plate.

11. The electrical box of claim 1, wherein the pivotal cover, housing, and an electrical cord passing through the cut out forms a weather proof barrier to protect an interior electrical connection.

12. The electrical box of claim 10, wherein the receptacle plate includes at least one aperture for receiving an electrical connection.

13. An outdoor electrical box for weather proofing an electrical connection comprising:
- four side walls and a base forming an interior space, a circumferential flange extending outwardly from each housing wall, the interior space including pegs for securing an electrical receptacle over an electric connection, the housing further including a pivotal cover plate with at least one opening proximate the latch of the cover plate which corresponds with an opening disposed near the lid latch of the housing, the at least one opening configured to receive a removable plug to prevent the intrusion of moisture when a cord is not in position; and
- a separate outer flange for engagement with the housing extending outward transversely from the side walls of the housing, the outer flange disposed beneath the circumferential flange and including at least one inwardly extending protrusion for use as a locking engagement with at least one corrugation disposed within an exterior edge of the outer housing wall.

14. The electrical box of claim 13, wherein the at least one corrugation is four corrugations which form a corrugated section.

15. The electrical box of claim 13, wherein the at least one corrugation is located on each of the four outer corners of the housing.

16. The electrical box of claim 15, wherein the at least one locking engagement on the outer flange is four locking engagements that correspond to the at least one corrugation located on each of the four outer corners of the housing.

17. The electrical box of claim 13, wherein the circumferential flange extends outwardly and downwardly.

18. The electrical box of claim 13, wherein the outer flange extends outwardly and downwardly.

19. The electrical box of claim 13, further comprising at least one knockout disposed on one of the four side walls or the base of the housing.

20. A kit for improving the resistance to water intrusion of an electrical receptacle, the electrical receptacle comprising:
- a housing with four sidewalls and a base which form an interior space having a means for securing an electrical receptacle within the housing, a circumferential flange extending from the upper edge of the housing, the housing further including a pivotal cover plate with at least one cut out disposed near the latch that corresponds to at least one cut out disposed near the lid latch of the housing wall and configured to receive a removable plug when the electrical connection is not in use; and
- an outer flange for engagement with the housing positioned below the circumferential flange and extending outward transversely from the side walls of the housing, the outer flange including at least one inwardly extending protrusion for use as a locking engagement with at least one corrugation disposed within an exterior corner of the side walls of the housing; and
- a receptacle plate.

21. The electrical box of claim 1, the stabilizing flange has a length in the range of 0.5 to 2.5 inches.

* * * * *